US007586783B2

(12) United States Patent
Lee

(10) Patent No.: US 7,586,783 B2
(45) Date of Patent: Sep. 8, 2009

(54) BLOCK STATUS STORAGE UNIT OF FLASH MEMORY DEVICE

(75) Inventor: Doo-Sub Lee, Suwon-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 90 days.

(21) Appl. No.: 11/563,966

(22) Filed: Nov. 28, 2006

(65) Prior Publication Data
US 2008/0049499 A1 Feb. 28, 2008

(30) Foreign Application Priority Data
Aug. 22, 2006 (KR) .................. 10-2006-0079536

(51) Int. Cl.
*G11C 16/04* (2006.01)
(52) U.S. Cl. .................. 365/185.11; 365/230.03; 365/230.05
(58) Field of Classification Search ........... 365/185.11, 365/230.03, 230.05
See application file for complete search history.

(56) References Cited

U.S. PATENT DOCUMENTS 5,065,363 A * 11/1991 Sato et al. ................ 365/154
5,353,256 A * 10/1994 Fandrich et al. ......... 365/185.11
5,369,754 A    11/1994 Fandrich et al.
7,359,275 B1 *  4/2008 Wu ....................... 365/230.05

FOREIGN PATENT DOCUMENTS

| JP | 64-019581 | 1/1989 |
| JP | 07-281952 | 10/1995 |
| JP | 2003-203493 | 7/2003 |
| JP | 2004-133993 | 4/2004 |
| JP | 2004-220772 | 8/2004 |
| JP | 2004-348788 | 12/2004 |
| JP | 2005-149547 A | 6/2005 |
| KR | 1020010016798 A | 3/2001 |
| KR | 1020050107088 A | 11/2005 |

* cited by examiner

*Primary Examiner*—Hoai V Ho
*Assistant Examiner*—Fernando N Hidalgo
(74) *Attorney, Agent, or Firm*—F. Chau & Associates, LLC

(57) ABSTRACT

A flash memory device includes: a memory cell array including pluralities of blocks; a block status storage unit including pluralities of latch cells arranged in rows and columns to store block status information signals corresponding to each of the blocks and providing the block status information signals in response to each of the write and read addresses; and a controller regulating an access to the memory cell array in response to the block status information signals. The block status storage unit provides information about whether a read address input during a read-while-write operation or suspend read operation is valid, and offers information about whether a current block is a write block or a write protection block.

13 Claims, 5 Drawing Sheets

BLOCK STATUS STORAGE UNIT OF FLASH MEMORY DEVICE

CROSS-REFERENCE TO RELATED APPLICATION

This U.S. non-provisional patent application claims priority under 35 U.S.C. §119 of Korean Patent Application No. 2002-79536 filed on Aug. 22, 2006, the entire contents of which are hereby incorporated by reference.

BACKGROUND

The present disclosure relates to semiconductor memory devices and, more particularly, to a block status storage unit of a flash memory device.

Flash memory devices are kinds of nonvolatile memories that are electrically programmable and that are erasable. Flash memory devices provide great interest to many users in applications for large-capacity or coded memories of mobile apparatuses with requirements for higher storage capacity and faster speed of operation. Flash memory devices may be classified into NAND and NOR types. A cell array of the NOR flash memory device is configured such that pluralities of memory cells are connected in parallel to one bit line. On the other hand, in a cell array of the NAND flash memory device, pluralities of memory cells are connected in series to one bit line. Comparing the two types with each other, the NOR flash memory devices are advantageously used in high frequency applications, because they are operable with a fast speed during programming and reading of data relative to the NAND types. A cell array of the NOR flash memory device includes a plurality of blocks forming erasing units. The plurality of blocks constitute a memory bank. A NOR flash memory device with a plurality of memory banks is able to carry out an erasing or a programming operation for one block while conducting a read operation for another block, both at the same time. Generally, the blocks are included in different respective memory banks. Further, a multi-block erasing mode is provided to erase pluralities of blocks, which are each selected by banks, all at a time. Additionally, in the NOR flash memory device, a suspended read mode is provided to carry out a read operation while suspending a writing operation during a period of writing. For these modes, storing and detecting status information to each block is required. Especially, in a flash memory device associated with the multi-block erasing mode or a read-while-write (RWW) mode, there is a need of simultaneously conducting operations for detecting block status information by write and read addresses. FIG. 1A shows a cell structure of a general purpose block status latch for storing and outputting block status information each in response to write and read addresses.

Referring to FIG. 1A, the general purpose block status latch includes a latch loop formed of inverters INV1 and INV2 coupled in opposite directions to each other between first and second nodes N1 and N2. The block status latch further includes set and reset transistors connected to SET and RESET inputs, for storing block status information in the latch loop. A NAND gate G1 outputs status information of the second node N2 in response to a read address RD_ADD, and a NAND gate G2 provides status information to another output terminal in response to a write address WD_ADD. Inverters INV3 and INV4 are respectively connected to outputs of the NAND gates G1 and G2. FIG. 1B shows output circuits summing a plurality of block status information provided from the block status latches shown in FIG. 1A.

Such a structure of a block status latch, which provides block status information independently of the read and write addresses, is disadvantageous to integration density, because the capacity of the flash memory device must be made larger. As the capacity of the flash memory device becomes larger, the number of blocks in a memory cell array also increases. With the increase of the number of blocks, the number of block status latches must also be increased. This means the area occupied by the block status latches in a peripheral circuit of a memory core is also increased. Furthermore, the area of the circuits, such as Summator1, Summator2 in FIG. 1B, summing a plurality of block status information enlarges the whole area of the peripheral circuit.

SUMMARY OF THE INVENTION

Exemplary embodiments of the present invention are directed to overcome the aforementioned problems, by providing a block status storage unit occupying a minimum area in a chip of a flash memory device.

An exemplary embodiment of the present invention is a flash memory device comprising: a memory cell array including pluralities of blocks; a block status storage unit including pluralities of latch cells arranged in rows and columns to store block status information signals corresponding to each of the blocks and providing the block status information signals in response to each of the write and read addresses; and a controller regulating an access to the memory cell array in response to the block status information signals.

In an exemplary embodiment of the present invention, the block status storage unit comprises: a block latch array including the latch cells arranged in rows and columns in correspondence with each of the blocks; a row selection circuit selecting each row in correspondence with the write and read addresses; a column selection circuit selectively outputting the block status information signals corresponding to each of the selected rows in response to the write and read addresses; and a write driver storing the block status information signals into the block latch array.

In an exemplary embodiment of the present invention, each latch cell comprises: a latch connected between first and second nodes; a first pass gate connecting the first node to a third node in response to a write address; and a second pass gate connecting the second node to a fourth node in response to a read address.

In an exemplary embodiment of the present invention, the latch is formed of a positive feedback loop with first and second inverters.

In an exemplary embodiment of the present invention, data states of the first and second nodes in the latch are complementary to each other.

In an exemplary embodiment of the present invention, the write driver provides complementary write signals to the third and fourth nodes at the same time for storing the block status information signals.

In an exemplary embodiment of the present invention, the write and read addresses are provided to the row selection circuit to turn on the first and second pass gates during an input of the write signal.

In an exemplary embodiment of the present invention, the row selection circuit comprises: a first decoder selecting a row in corresponding with a write address; and a second decoder selecting a row in corresponding with a read address.

In an exemplary embodiment of the present invention, the column selection circuit comprises: a first multiplexer that selects the first block status information signal in response to the write address; and a second multiplexer that selects the second block status information signal in response to the read address.

In an exemplary embodiment of the present invention, the write driver is provided with a block status information signal corresponding to the write address.

In the exemplary embodiment of the present invention, the flash memory device further comprises: a write-protection information storage unit storing write-protection information signals in corresponding with each of the blocks and providing the write-protection information signals to the controller in response to each of the write and read addresses.

In an exemplary embodiment of the present invention, the write-protection information storage unit is configured in the same structure as the block status storage unit.

In an exemplary embodiment of the present invention, the write-protection information storage unit is provided with the write-protection information signals by way of a command and the write address.

An exemplary embodiment of the present invention is a latch cell comprising: a latch connected between first and second nodes; a first pass gate connecting the first node to a third node in the latch in response to a first selection signal; and a second pass gate connecting the second node to a fourth node in the latch in response to a second selection signal.

In an exemplary embodiment of the present invention, the latch is formed of a positive feedback loop with first and second inverters.

In an exemplary embodiment of the present invention, data states of the first and second nodes in the latch are complementary to each other.

In an exemplary embodiment of the present invention, a data state of the latch is set by complementary write signals applied simultaneously to the third and fourth nodes.

In an exemplary embodiment of the present invention, the first and second selection signals are provided to turn on the first and second pass gate at the same time when there is an input of a write signal.

Still another exemplary embodiment of the present invention is a block status storage unit of a semiconductor memory device, comprising: a latch array including the latch cells arranged in rows and columns; a row selection circuit selecting rows in corresponding with each of the first and second row addresses; a column selection circuit selectively outputting the block status information signals corresponding to the selected rows in response to each of the first and second column addresses; and a write driver storing data into the latch cells selected by the row selection circuit during a writing operation.

In an exemplary embodiment of the present invention, each latch cell outputs data in response to each of the first and second row addresses.

In an exemplary embodiment of the present invention, the write driver provides the latch cells with complementary write signals in correspondence with the data.

In an exemplary embodiment of the present invention, the row selection circuit comprises: a first decoder selecting a row in correspondence with the first row address; and a second decoder selecting a row in correspondence with a second row address.

In an exemplary embodiment of the present invention, the column selection circuit comprises: a first multiplexer selecting first data in response to a first column address; and a second multiplexer selecting second data in response to a second column address.

A further understanding of the nature and advantages of exemplary embodiments of the present invention herein may be realized by reference to the remaining portions of the specification and the attached drawings.

BRIEF DESCRIPTION OF THE FIGURES

Exemplary embodiments of the present invention will be understood in more detail from the following descriptions taken in conjunction with the following figures, wherein like reference numeral refer to the like parts throughout the various figures unless otherwise specified. In the figures.

DETAILED DESCRIPTION OF EXEMPLARY EMBODIMENTS

Figure 1A:
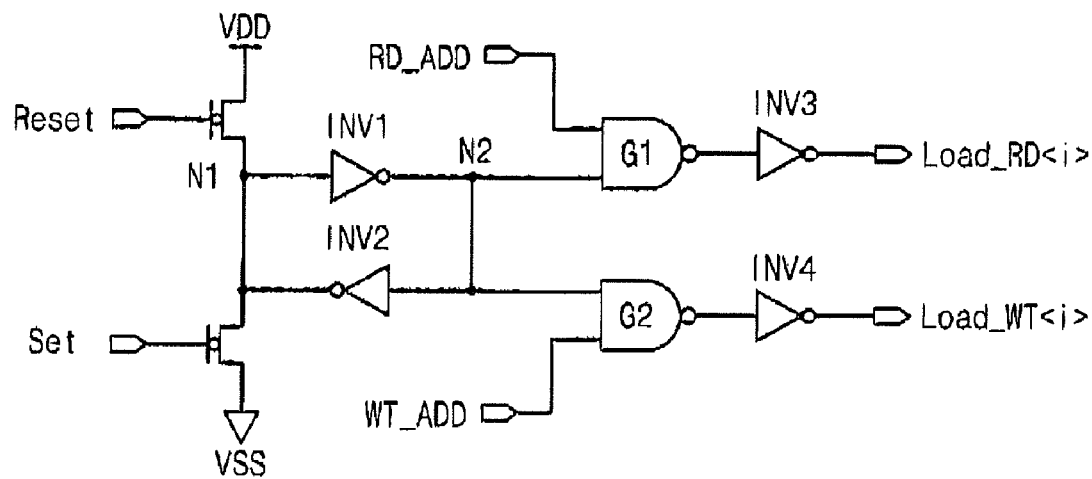
FIG. 1A is a circuit diagram showing a cell structure of a known block status latch.
Figure 1B:
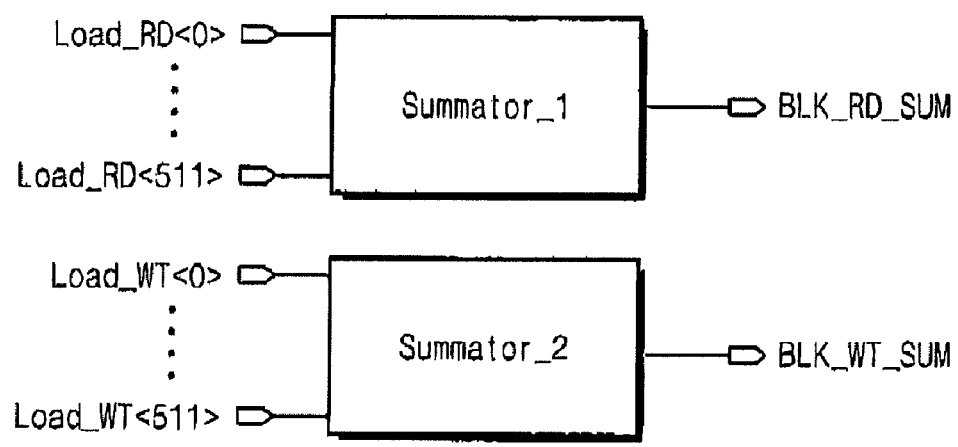
FIG. 1B is a block diagram showing the summing of output signals of FIG. 1A.

Exemplary embodiments of the present invention will be described below in more detail with reference to the accompanying drawings. The present invention may, however, be embodied in different forms and should not be constructed as limited to the exemplary embodiments set forth herein. Rather, these exemplary embodiments are provided so that this disclosure will be thorough and complete, and will fully convey the scope of the present invention to those skilled in the art. Like reference numerals refer to like elements throughout the accompanying figures.

Figure 2:
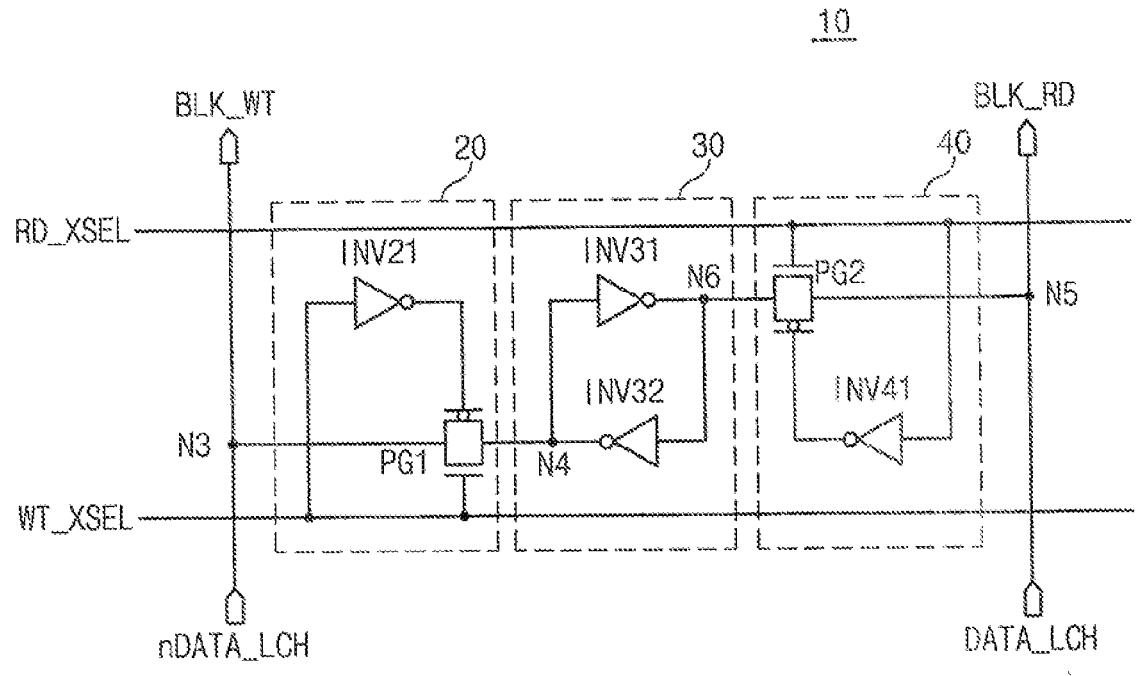
FIG. 2 is a circuit diagram briefly illustrating a cell structure of a block status latch in accordance with an exemplary embodiment of the present invention.

FIG. 2 is a circuit diagram illustrating a cell structure of a block status latch in accordance with an exemplary embodiment of the present invention. Referring to FIG. 2, the latch cell 10 is comprised of a latch 30, and first and second switches 20 and 40 each interrupting nodes N4 and N6 that correspond to both ends of the latch 30. If a latch cell array is organized with a plurality of such a simple latch arranged in rows and columns, it increases the storage capacity for block status information and relatively decreases a required chip area.

The latch cell 10 includes two inverters INV31 and INV32 connected between the fourth and sixth nodes N4 and N6. The first switch 20 connects or disconnects the fourth node N4 relative to a third node N3, and the second switch 40 connects or disconnects the sixth node N6 relative to a firth node N5.

In operation of the latch cell 10 according to an exemplary embodiment of the present invention, block status information latched at the fourth node N4 is transferred to the third node N3 by a write selection signal WT_XSEL. The block status information transferred to the third node N3 is then output as a write status information signal BLK_WT. Responding to a read selection signal RD_XSEL, the block status information stored at the sixth node N6 of the latch 30 is transferred to the fifth node N5. The block status information transferred to the fifth node N5 is then output as a read status information signal BLK_RD. The write and read status information signals, BLK_WT and BLK_RD, function as row addresses in a general semiconductor memory device. More importantly, the latch cell 10 responds independently to the write and read status information signals BLK_WT and BLK_RD. Thus, write and read status information signals, BLK_WT and BLK_RD, can be output independently from each other.

Hereinafter an input operation of block status information into the latch cell 10 will be described. Block status information is loaded on the latch 30 through the third and fifth nodes N3 and N5 used as simultaneous input terminals. In order to transfer complementary write signals nDATA_LCH and DATA_LCH, which correspond to the block status information, to the fourth and sixth nodes N4 and N6 simultaneously through the third and fifth nodes N3 and N5, the first and second switches 20 and 40 are turned on at the same time. To accomplish this, the write and read selection signals WT_XSEL and RD_XSEL must be also activated at the same time in the loading operation of the block status information. If the write and read selection signals WT_XSEL and RD_XSEL are activated at the same time, the first and second switches 20 and 40 are simultaneously turned on. Then, the complementary write signals nDATA_LCH and DATA_LCH simultaneously provided from a write driver (not shown) are transferred to the forth and sixth nodes N4 and N6, respectively. In this way, the block status information is loaded on the latch cell 10.

As aforementioned, the latch cell 10 is formed with a simple structure including a pair of switches 20 and 40, with the latch 30 connected between the switches 20 and 40. Through the nodes N3 and N5, the write and read block status information signals BLK_WT and BLK_RD are independently output in response respectively to the write and read selection signals WT_XSEL and RD_XSEL. Further, a writing operation of the block status information is accomplished by applying the complementary write signals nDATA_LCH and DATA_LCH to the third and fifth nodes N3 and N5, so as to simultaneously turn on the first and second switches 20 and 40.

Figure 3:
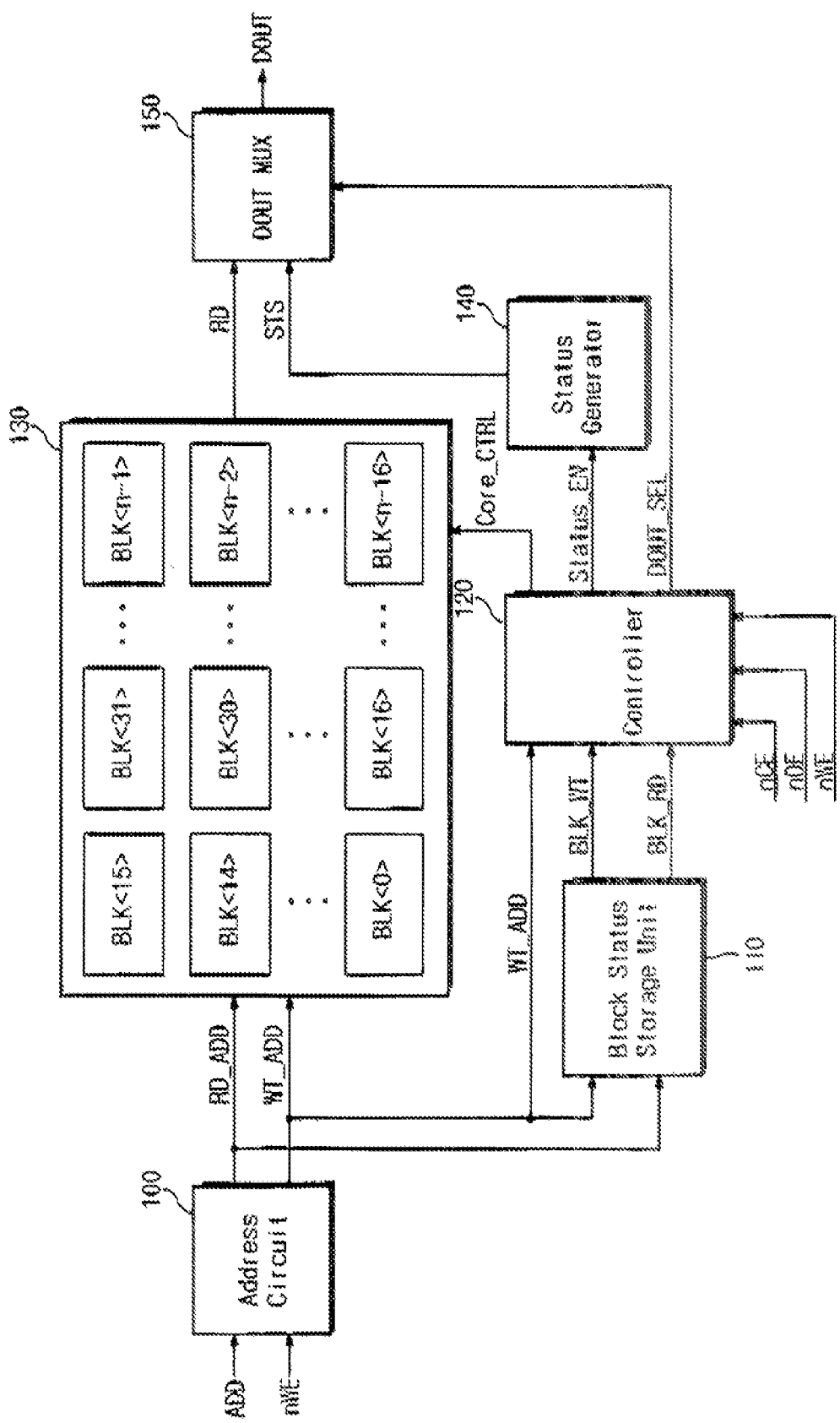
FIG. 3 is a block diagram of a flash memory device employing the block status latch of FIG. 2.

FIG. 3 is a block diagram of a flash memory device employing a block status storage unit 110 with a latch array composed of a plurality of the latch cells 10, as shown in FIG. 2. Referring to FIG. 3, the block status storage unit 110 output the write and read status information signals BLK_WT and BLK_RD in response to each write and read addresses WT_ADD and RD_ADD fed thereto. The write and read status information signals BLK_WT and BLK_RD are transferred to a controller 120 where they are used as status information for their corresponding blocks.

An address circuit 100 provides the write and read addresses WT_ADD and RD_ADD to the block status storage unit 110 and the write address NT_ADD to the controller in response to externally supplied addresses ADD. The address circuit 100 provides the block status storage unit 110 with a block address, which is used to designate a block, among the addresses ADD. The write addresses WT_ADD are counted up and sequentially provided in response to a start address. The read addresses RD_ADD are same as the externally supplied addresses ADD.

The block status storage 110 includes a plurality of the latch cells 10 shown in FIG. 2 and outputs block status information from the latch cells 10 in response to the write and read addresses WT_ADD and RD_ADD fed thereto. The block status storage unit 110 generates the write block status information signal BLK_WT in response to the write address WT_ADD. The write block status information signal BLK_WT represents whether its corresponding block is a block to be programmed. The block status storage unit 100 generates the read block status information signal BLK_RD in response to the read address RD_ADD. The read block status information signal BLK_RD represents whether its corresponding block is a block to be read. Therefore, for the same block, the write and read block status information signals BLK_WT and BLK_RD are complementary to each other. In this case it is advantageous that the write and read addresses WT_ADD and RD_ADD provided to the block status storage unit 110 are block addresses. Thus, the block status storage unit 110 loads the block status information therein in response to the write address WT_ADD.

The controller 120 accesses a memory core 130, which includes a memory cell array, in response to externally supplied control signals nWE, nCE, and nOE, and the block status information signals BLK_WT and BLK_RD. When there is an input of the write address WT_ADD, the controller 120 finds the status of the block, which is designated by the write address WT_ADD, through the block status information signals BLK_WT and BLK_RD stored in the block status storage unit 110. During the programming and erasing modes, the controller 120 executes the programming and erasing operations with reference to the write block status information signal BLK_WT corresponding to the write address WT_ADD fed thereto. During a read mode, the controller 120 determines access to a corresponding block with reference to the read block status information signal BLK_RD. In a read-while-write (RWW) mode, the controller 120 is able to obtain all block status information about blocks to be programmed and read. Even in an erasure or program suspend/resume mode, the controller 120 is also able to respectively obtain block status information about blocks different from each other at the same time.

As also illustrated in FIG. 2, the controller 120 determines whether a status information signal STS or a read data signal RD with reference to the block status information signals BLK_WT and BLK_RD and the write block address WT_ADD fed thereto should be produces by the memory core 130 and a status generator 140, respectively. As a result of the determination, the controller 120 applies an output selection signal DOUT_SEL to an output multiplexer 150.

The memory core 130 includes a plurality of memory cell blocks corresponding to the block status information stored in the block status storage unit 110. The memory core 130 is operable in the programming and read operation, the erasure suspend/resume mode, or the program suspend/resume operation under regulation of the controller 120. It is well known, although not shown, that the memory core 130 may include a memory cell array, a decoder, and a data input/output circuit.

The status information generator 140 receives a status enable signal STS_EN generated by the controller 120 in response to the block status information signals BLK_WT and BLK_RD and the write address WT_ADD. When there is an input of a read address to a block that is active in a writing or erasing operation, this state may be communicated to the other elements (not shown) of the system. The status information signal STS sent from the status generator 140 to the output multiplex 150 represents a condition in which it is impossible to output data in correspondence with a red address.

The output multiplexer 150 outputs one or the other of the read data signal RD and the status information signal STS in response to the output selection signal DOUT_SEL from the controller 120.

In operation of the system shown in FIG. 3, the block status storage unit 110 provides the block status information signals BLK_WT and BLK_RD to the controller 120 in response each to the write and read addresses WT_ADD and RD_ADD. The controller 120 accesses the memory core 130 on basis of input commands and addresses, referring to the block status information signals BLK_WT and BLK_RD provided from the block status storage unit 110. When the read address RD_ADD currently being input is identical to the block address of a block being active in a programming or erasing operation, the read operation is suspended using a memory core control signal Core-CTRL from the controller 120. On the other hand, when the read address RD_ADD currently being input corresponds to the block address of a block different from a block being active in a programming or erasing operation, the controller 120 regulates the memory core 130 to detect and output data from the block corresponding to the read address RD_ADD using the memory core control signal Core-CTRL from the controller 120. In the order to assist this operation, the block status storage unit 110 is needed to provide the controller 120 with the block status information signals BLK_WT and BLK_RD in response to each of the write and read addresses WT_ADD and RD_ADD.

Figure 4:
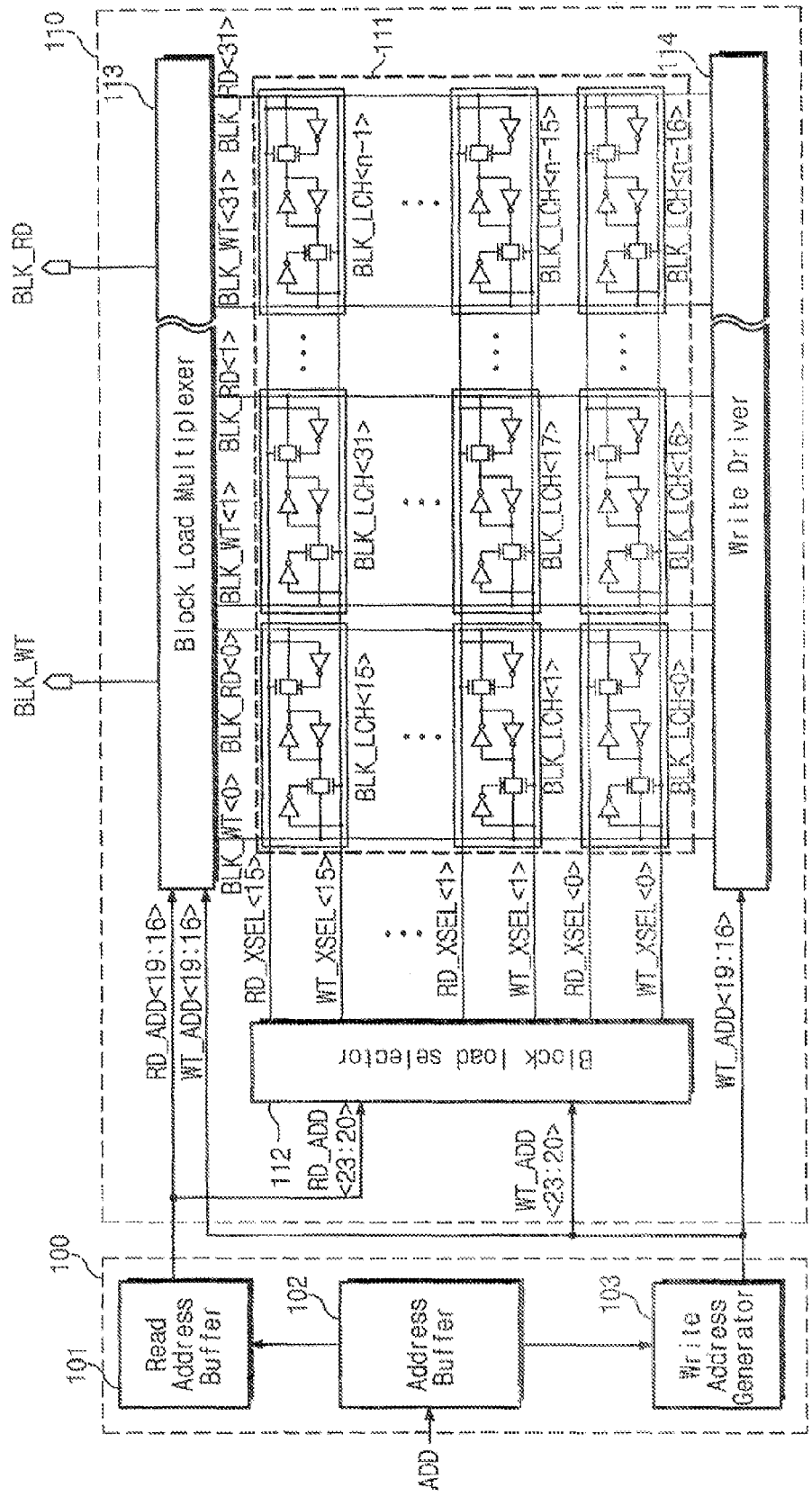
FIG. 4 is a block diagram illustrating a structure of the block status storage unit shown in FIG. 3.

FIG. 4 is a block diagram illustrating the structure of the block status storage unit 110 shown in FIG. 3. Referring to FIG. 4, the block status storage unit 110 includes a latch array 111 composed of the plurality of latch cells arranged in rows and columns. The block status storage unit 110 is also comprised of a block load selector 112 and a block load multiplexer 113 for outputting the block status information signals BLK_WT and BLK_RD from the latch array 111 in response to the write and read addresses WT_ADD and RD_ADD. The block status storage unit 110 is further comprised of a write driver 114 to write the block status information into the latch cells in response to the write addresses WT_ADD. A functional structure of the address circuit 100 is shown in FIG. 3.

The address circuit 100 is formed to include an address buffer 102, a read address buffer 101, and write address generator 103. The external address ADD input to the address buffer 102 is provided to the read address buffer 101 and the write address generator 103, being generated as the read and write addresses RD_ADD and WT_ADD. The read and write addresses RD_ADD and WT_ADD may be provided as a block address, or sector address. The read and write addresses RD_ADD and WT_ADD are provided to the block status storage unit 110.

The block status storage unit 110 includes the latch array 111 in which the latch cells 10 of FIG. 2 are arranged in rows and columns. The latch array 111 may be organized with physical addresses identical to the block arrangements of the cell array 130 shown in FIG. 3.

The block load selector 112 operates to select rows for outputting the read block status information signal BLK_RD<x> in response to the read address RD_ADD<23: 30>. The block load selector 112 operates to select rows in the same manner with an X-decoder of a general memory device. The block load selector 112 activates one of the row selection lines RD_XSEL<0>~RD_XSEL<15>, which corresponds to the read selection signals, in order to select one of the rows corresponding to the read status information signal BLK_RD<x> in response to the read address RD_ADD<23: 20>. The row selection line R_XSEL<0> controls the latch cells to output the read block status information signal BLK_RD<x> from the latch cells. The block load selector 112 activates one of the column selection lines WT_XSEL<0>~WT_XSEL<15>, which corresponds to the write selection signals, in response to the write address WT_ADD<23:20>, independently from the operation for activating one of the row selection lines RD_XSEL<0>~RD_XSEL<15>. The column selection line WT_XSEL<x> controls the latch cells to output the write block status information signal BLK_WT<x> from the latch cells. The operation by the block load selector 112 is carried out in response independently to the read and write addresses RD_ADD<23:20> and WT_ADD<23:20>. Therefore, it is able to output the block status information signals BLK_WT and BLK_RD at the same time, even when there is a simultaneous input of the read and write addresses RD_ADD<23: 20> and WT_ADD<23:20>.

The block load multiplexer 113 operates to select columns just as a column selection circuit of a general memory device. But, the block load multiplexer 113 outputs the block status information signals BLK_WT and BLK_RD in response to the read and write addresses RD_ADD<19:16> WT_ADD<19:16>, which are input thereto independently. The block load multiplexer 113 conducts a column selecting operation for outputting the read block status information signal BLK_RD<x> in response to the read address RD_ADD<19:16>. Independent from this operation, the block load multiplexer 113 conducts another column selecting operation for outputting the write block status information signal BLK_WT<x> in response to the write address WT_ADD<19:16>. The block load multiplexer 113 outputs the read block status information signal BLK_RD for selecting one, which matches with the read address RD_ADD<19: 16>, from among a plurality of the read block status information signals BLK_RD<x> output from the latch cells arranged in the same row designated by the block load selector 112. The write block status information signal BLK_WT is selected in the same manner as the read block status information signal BLK_RD, but those output operations for BLK_WT and BLK_RD are carried out independently from each other.

The write driver 114 writes the block status information signals with respect to each of the blocks into the latch cells, as shown at 10 in FIG. 2. The status information signal block is obtained from the input of an address, that is, block address, including block status information in a general programming or erasing operation.

As aforementioned, the latch array 111 of the block status storage unit 110 provides the respective status information signals for each of the blocks designated by the addresses independently in response to the write and read addresses WT_ADD and RD_ADD. This feature is advantageous in reducing the circuit area occupied by the latches, and in quickly providing the block status information during an erasure suspend/resume, program suspend/resume, or RWW operation.

Figure 5:
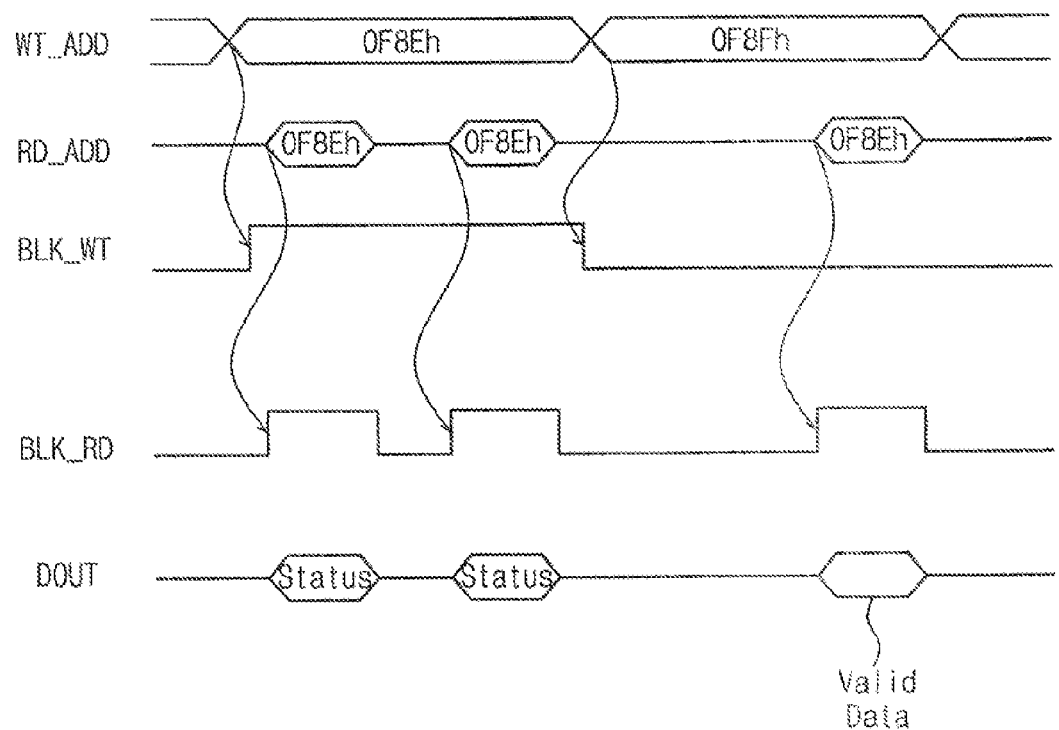
FIG. 5 is a timing diagram showing operational patterns of output signals from the flash memory device in accordance with an address input.

FIG. 5 is a timing diagram showing operational patterns our output signals from the NOR flash memory device employing the block status storage unit 110 of FIGS. 3 and 5. In FIG. 5, there is shown an input/output characteristic when the block status storage unit 110 is set to represent that a specific block is active in an erasing and programming operation. FIG. 5 also depicts waveforms of the write and read address, that is, block addresses, WT_ADD and RD_ADD and the output data DOUT corresponding to the block addresses. An input/output operation of the block status storage unit 110 will hereinafter be described with reference to FIGS. 4 and 5.

Initially, it is assumed that the flash memory device is in the operation of writing data into a block corresponding to an address '0F8Eh', for example. In this case, the block address '0F8Eh' would be loaded on a latch cell corresponding to the block my means of the write driver 114, so as to inform the system that the block is being erased or programmed. When the write addresses WT_ADD output from the write address generator 103 are continuously input to the block having the address '0F8Eh', the write block status information signal BLK_WT is output with a high level. At the same time, it is able to randomly input the externally supplied read address RD_ADD. The read address RD_ADD may be input as the same block address with the write address WT_ADD counted up internally. Thus, if the read address RD_ADD is input as the block address '0F8Eh' corresponding to a block being active in a writing operation, the read block status information signal BLK_RD is output with a high level. The read block status information signal BLK_RD of the high level means that the read address RD_ADD input at present corresponds to the same block being active in a writing operation. In this exemplary embodiment it is impossible to conduct writing and reading operations in the same block. Therefore, the write and read block status information signals, as outputs for the block address '0F8Eh' that is the write and read address, become high levels. In this case, the controller 120 of FIG. 3 may control the memory core 130 of FIG. 3 not to conduct the reading operation, but on the other hand enabling a writing operation. Thereby, the data output circuit (not shown) of the memory core 130 may output invalid data.

On the other hand, the case that the write address WT_ADD designates another block not a currently loading block and the read address RD_ADD designates another block different from the write address WT_ADD will now be described. According to the write and read addresses, that is, WT_ADD:0F8Fh and RD_ADD: 0F8Eh, that are different from each other, the block status storage unit 110 outputs the write block status information signal BLK_WT of a low level informing the system that the block designated by the write address is not being conditioned in a writing operation. But, because it is possible to access the block with the address '0F8Eh' after completing the writing operation, the read block status information signal BLK_RD is output with a high level. As a result, memory cells with the entire addresses including the block address '0F8Eh' are accessed and thereby valid data may be output from the memory core 130.

In the above-described exemplary embodiment, the block status storage unit 110 is used to store the block status information BLK_WT and BLK_RD that represent that a corresponding block is to be written or read, but the present invention is not restricted to this exemplary embodiment. For instance, the block status storage unit 110 according to exemplary embodiments of the present invention is able to store block protection information for assisting a function of inhibiting a block from being written in order to protect data of the block, as well as the block status information. The block status storage unit 110 storing block protection information, during a writing operation, determines whether an input write address WT_ADD corresponds to a block to be protected, and then provides write protection status information to the controller 120. When a corresponding block is a protection block to be writing inhibited, the controller 120 inhibits the protection block from being written. For instance, in a check mode, for example, an auto-selected read operation, for determining to inhibit an externally supplied block from being written in a general flash memory, the write protection information for a block may be provided externally in response to the read address RD_ADD input thereto. Through these operations for storing block status information, it is possible to provide overall block status information for determining access to a block by means of the block status storage unit 110.

According to the above-described exemplary embodiments, the block status storage unit 110 it is possible to store the write block status information and the write protection information representing whether a block corresponding to the write and read addresses is inhibited from being written.

Further, it is also possible to respectively provide that block status information signals BLK_WT and BLK_RD by way of a block status storage unit and the write protection information by way of another block status unit. While this exemplary embodiment is described relative to the case that the block status information stored in the latch cells informs a state of the corresponding block, the present invention is not restricted to this exemplary embodiment. Otherwise, the latch cells may store status information about a cell array larger or smaller than the block like the aforementioned.

Consequently, the block status storage unit according to an exemplary embodiment of the present invention is configured to have an array of latches arranged in rows and columns, thereby reducing a circuit area occupied by latches in a chip of a flash memory device.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising:
   a memory cell array including a plurality of blocks;
   a block status storage unit including a plurality of latch cells arranged in rows and columns to store block status information signals including a write status information signal and a read status information signal corresponding to each of the blocks and outputting the block status information signals in response to write and read addresses for the memory cell array being fed thereto, wherein the write status information signal and the read status information signal are provided at the same time even when a write select signal and a read select signal are activated simultaneously; and
   a controller producing a control signal for regulating an access to the memory cell array in response to the block status information signals output from the block status storage unit.

2. The flash memory device as set forth in claim 1, wherein the block status storage unit comprises:
   a block latch array including the plurality of latch cells arranged in rows and columns in correspondence with each of the plurality of blocks of the memory cell array;
   a row selection circuit selecting rows in correspondence with each of the write and read addresses;
   a column selection circuit selectively outputting the block status information signals corresponding to the selected rows in response to each of the write and read addresses; and
   a write driver storing the block status information signals into the block latch array.

3. The flash memory device as set forth in claim 2, wherein each latch cell comprises:
   a latch connected between first and second nodes;
   a first pass gate connecting the first node to a third node in response to the write select signal; and
   a second pass gate connecting the second node to a fourth node in response to the read select signal.

4. The flash memory device as set forth in claim 3, wherein the latch is formed of a positive feedback loop with first and second inverters.

5. The flash memory device as set forth in claim 3, wherein data states of the first and second nodes in the latch are complementary to each other.

6. The flash memory device as set forth in claim 3, wherein the write driver provides complementary write signals to the third and fourth nodes at the same time for storing the block status information signals.

7. The flash memory device as set forth in claim 6, wherein the write and read addresses are provided to the row selection circuit to turn on the first and second pass gates during an input of the write signal.

8. The flash memory device as set forth in claim 2, wherein the row selection circuit comprises:
- a first decoder selecting a row in correspondence with the write address; and
- a second decoder selecting a row in correspondence with the read address.

9. The flash memory device as set forth in claim 2, wherein the column selection circuit comprises:
- a first multiplexer selecting the first block status information signal in response to the write address; and
- a second multiplexer selecting the second block status information signal in response to the read address.

10. The flash memory device as set forth in claim 2, wherein the write driver is provided with the block status information signal corresponding to the write address.

11. The flash memory device as set forth in claim 1, further comprising:
- a write-protection information storage unit storing write-protection information signals in correspondence with each of the plurality of blocks and providing the write-protection information signals to the controller in response to each of the write and read addresses.

12. The flash memory device as set forth in claim 11, wherein the write-protection information storage unit is configured in the same structure as the block status storage unit.

13. The flash memory device as set forth in claim 11, wherein the write-protection information storage unit is provided with the write-protection information signals by way of a command and the write address.

* * * * *